United States Patent
Wieczorek et al.

(10) Patent No.: US 6,812,115 B2
(45) Date of Patent: Nov. 2, 2004

(54) METHOD OF FILLING AN OPENING IN A MATERIAL LAYER WITH AN INSULATING MATERIAL

(75) Inventors: Karsten Wieczorek, Dresden (DE); Stephan Kruegel, Boxdorf (DE); Michael Raab, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/403,584

(22) Filed: Mar. 31, 2003

(65) Prior Publication Data

US 2004/0018696 A1 Jan. 29, 2004

(30) Foreign Application Priority Data

Jul. 26, 2002 (DE) .......................... 102 34 165

(51) Int. Cl.[7] .............................................. H01L 21/76
(52) U.S. Cl. .................... 438/424; 438/426; 438/430; 438/431; 438/435; 438/699; 438/701; 438/703; 438/723; 438/724; 438/752; 438/787; 438/791; 438/933
(58) Field of Search ................ 438/752, 778, 438/787, 791, 933, FOR 134, FOR 167, FOR 221, FOR 222, FOR 227, FOR 291, FOR 292, 431, 285, 404, 424, 425, 426, 430, 435, 694, 696, 699, 701, 703, 723, 724

(56) References Cited

U.S. PATENT DOCUMENTS

| | | | |
|---|---|---|---|
| 4,666,556 A | * | 5/1987 | Fulton et al. ............... 438/431 |
| 5,116,779 A | | 5/1992 | Iguchi ......................... 437/67 |
| 5,332,683 A | | 7/1994 | Miyashita et al. ............ 437/33 |
| 5,719,085 A | * | 2/1998 | Moon et al. ................ 438/424 |
| 5,837,612 A | * | 11/1998 | Ajuria et al. ............... 438/697 |
| 6,074,931 A | * | 6/2000 | Chang et al. ............... 438/424 |
| 6,080,627 A | * | 6/2000 | Fan et al. .................... 438/270 |
| 6,146,970 A | * | 11/2000 | Witek et al. ................ 438/424 |
| 6,207,531 B1 | * | 3/2001 | Pen-Liang .................. 438/424 |
| 6,399,512 B1 | * | 6/2002 | Blosse et al. ............... 438/723 |
| 6,573,154 B1 | * | 6/2003 | Sridhar et al. ............. 438/430 |
| 2001/0004543 A1 | * | 6/2001 | Moore ........................ 438/402 |
| 2002/0160580 A1 | * | 10/2002 | Hahn ......................... 438/429 |
| 2002/0182819 A1 | * | 12/2002 | Schrems et al. ........... 438/386 |
| 2003/0139051 A1 | * | 7/2003 | Andideh et al. ............ 438/692 |

FOREIGN PATENT DOCUMENTS

| | | | | |
|---|---|---|---|---|
| EP | 0 631 306 A1 | 6/1994 | .......... | H01L/21/76 |
| EP | 0 635 884 A1 | 6/1994 | .......... | H01L/21/74 |
| JP | 01099230 A | 4/1989 | .......... | H01L/21/76 |
| JP | 05095045 A | 4/1993 | .......... | H01L/21/76 |

\* cited by examiner

*Primary Examiner*—George Fourson
*Assistant Examiner*—Joannie Adelle Garcia
(74) *Attorney, Agent, or Firm*—Williams, Morgan & Amerson, P.C.

(57) ABSTRACT

The filling of sub-0.25 μm trenches with dielectric material may lead to the formation of a void. Typically, the void may be closed by oxidation. When the trench includes non-oxidizable sidewall portions, insufficient closure may result. Therefore, an oxidizable spacer layer is conformally deposited prior to depositing the bulk dielectric, so that the sidewalls of the trench may be oxidized along the entire depth of the trench, thereby allowing the complete closure of the void.

59 Claims, 7 Drawing Sheets

METHOD OF FILLING AN OPENING IN A MATERIAL LAYER WITH AN INSULATING MATERIAL

BACKGROUND OF THE INVENTION

1. Field of the Invention

The present invention relates to the field of fabrication of integrated circuits, and, more particularly, to filling openings, such as trenches, with an insulating material to thereby form, for example, shallow trench isolation structures required in sophisticated integrated circuits.

2. Description of the Related Art

Modern integrated circuits comprise a huge number of circuit elements, such as resistors, capacitors, transistors and the like. Typically, these circuit elements are formed on and in a semiconductor layer, such as a silicon layer, wherein it is usually necessary to substantially electrically insulate adjacent semiconductor regions from each other, in which the individual circuit elements are formed. A representative example in this respect is a field effect transistor, the active area of which, i.e., the highly doped drain and source regions with an inversely lightly doped channel region disposed therebetween, is defined by an isolation structure formed in the semiconductor material.

Since critical feature sizes of the circuit elements, such as the gate length of field effect transistors, are steadily decreasing, the area enclosed by the isolation structures, as well as the isolation structures themselves, are also reduced in size. Among the various techniques for forming the isolation structures, the so-called shallow trench isolation (STI) technique has proven to be the most reliable method and has become the most frequently used technique for forming isolation structures for sophisticated integrated circuits.

According to the STI technique, individual circuit elements are insulated from each other by shallow trenches etched into the semiconductor material, i.e., a semiconductor substrate when bulk semiconductor devices are considered or a semiconductor layer formed on an insulating substrate as in the case, for example, for silicon-on-insulator (SOI) substrates, in which the circuit elements are to be formed. The trenches are subsequently filled with a dielectric material, such as an oxide, to provide the required electrical insulation of adjacent circuit elements. Although this technique has proven to be very reliable for the dimensions of trenches on the order of micrometers, reliability problems, such as increased leakage currents and the like, may arise for devices defined by sub-micron design rules, as will be explained in the following in more detail.

Figure 1A:
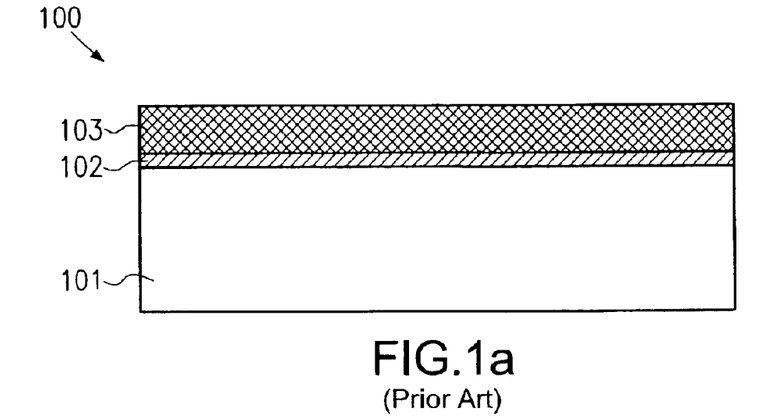
FIGS. 1a–1h schematically show cross-sectional views of a typical conventional process flow for forming shallow trench isolations as used in sophisticated integrated circuits.

With reference to FIGS. 1a–1f, a typical conventional process flow for forming a shallow trench isolation will now be described. In FIG. 1a, a semiconductor structure 100 comprises a substrate 101 that may include a semiconductor layer or that may be a semiconductor substrate, such as a silicon substrate, in and on which circuit elements, such as field effect transistors and the like, have to be formed. Moreover, a silicon dioxide layer 102 is formed on the substrate 101 followed by a silicon nitride layer 103.

Typically, the silicon dioxide layer 102 is formed by thermally oxidizing the substrate 101 and, subsequently, the silicon nitride layer 103 is deposited by, for example, chemical vapor deposition (CVD), such as low pressure CVD (LPCVD). Subsequently, a layer of photoresist (not shown) is applied to the semiconductor structure 100 and is patterned by sophisticated photolithography and etch techniques in accordance with design requirements. In the example described herein, the trench isolation to be formed may be designed to have a width on the order of 0.25 μm or less and the photoresist layer is correspondingly patterned to serve as an etch mask for a subsequently performed anisotropic etch step.

Figure 1B:
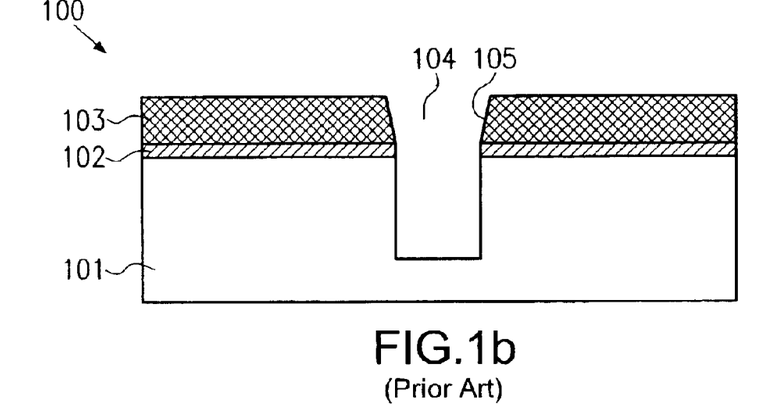

FIG. 1b schematically shows the semiconductor structure 100 with a trench 104 formed in the silicon nitride layer 103, the silicon dioxide layer 102 and partially in the substrate 101. Typically, the trench 104 is etched with a depth of approximately 400–500 nm for the above specified width. Moreover, preferably, the anisotropic etch step for etching the silicon nitride layer 103 is designed to generate a tapered sidewall portion 105 that may promote the fill capability of a subsequent deposition step.

Figure 1C:
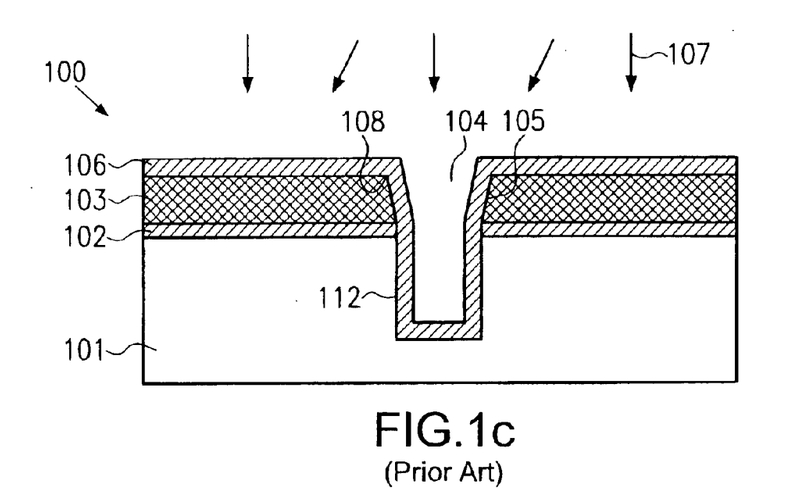

FIG. 1c schematically shows the semiconductor structure 100 during an initial stage of a deposition step to fill the trench 104 with silicon dioxide. In FIG. 1c, a relatively thin silicon dioxide layer 106 is already formed on the silicon nitride layer 103 and inside the trench 104. For depositing the silicon dioxide layer 106 into the trench 104 having dimensions of 0.25 μm and less, sophisticated deposition techniques have to be used to achieve a high degree of fullness in the trench 104. Preferably, sub-atmospheric CVD deposition techniques are used for filling trenches having a width of 0.25 μm and sophisticated high density plasma-enhanced CVD deposition techniques may be used for a trench width less than 0.25 μm. Although these deposition techniques allow oncoming particles 107 to be deposited in a highly conformal manner within the trench 104, the upper sidewall portions 105, even though slightly tapered, will receive a thicker silicon dioxide layer during the ongoing deposition, since the number of oncoming particles 107 at corner portions 108 is higher than the number of particles 107 impinging on central sidewall portions 112 of the trench 104.

Figure 1D:
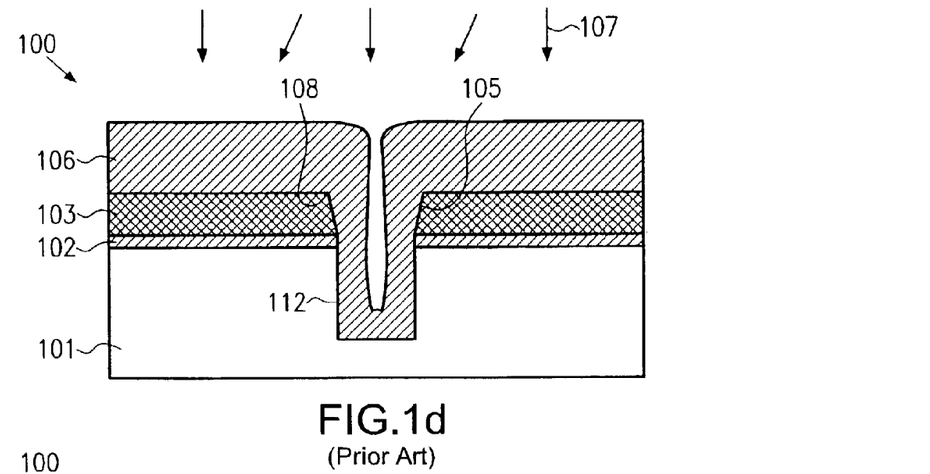

FIG. 1d illustrates this situation, when the thickness of the silicon dioxide layer 106 has increased during the deposition so that the trench 104 is nearly closed at the corner portions 108, thereby substantially preventing any further deposition of silicon dioxide within the trench 104.

Figure 1E:
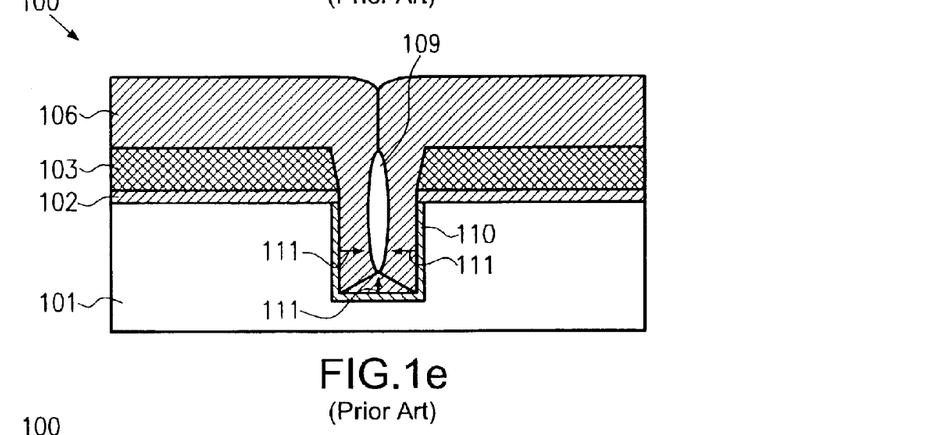

FIG. 1e schematically depicts the semiconductor structure 100 after completion of the deposition step, wherein a void 109 is formed within the trench 104. Since the void 109 is highly undesirable for further processing of the semiconductor structure 100, great efforts are made to at least reduce the size of the void 109. To this end, the semiconductor structure 100 is heated in an oxidizing ambient to a temperature of approximately 900° C. to, on the one hand, to densify the silicon dioxide layer 106 and, on the other hand, to further oxidize silicon at the interface between the trench 104 and the substrate 101, as indicated by the layer 110. During this heat treatment, oxygen diffuses into the silicon dioxide layer 106 and thus into the trench 104 and leads to a further oxidation of the substrate 101. Upon oxidation of the substrate 101, stress is applied to the deposited silicon dioxide layer 106 within the trench 104, since the newly grown silicon dioxide adjacent to the deposited silicon dioxide 106 occupies a larger volume than the silicon consumed by the oxidation process. In FIG. 1e, the additional oxidized portion is indicated by 110 and the induced stress is indicated by arrows 111.

Figure 1F:
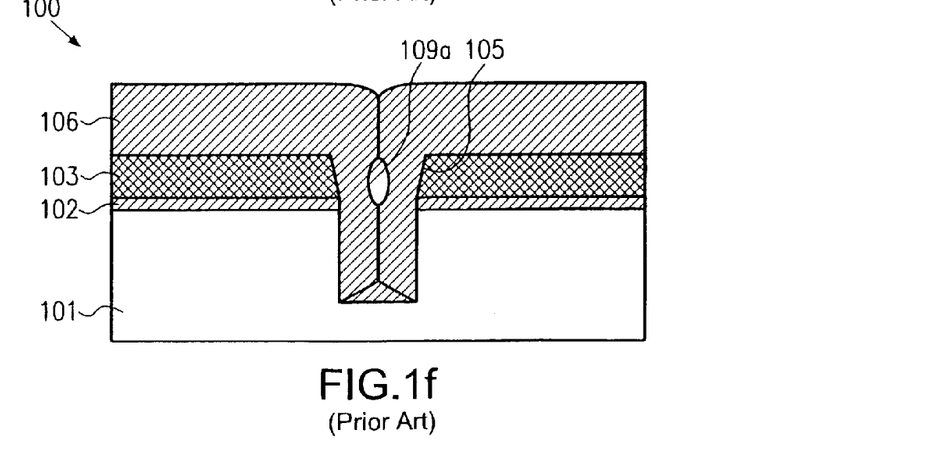

FIG. 1f schematically depicts the semiconductor structure 100 after completion of the thermal oxidation process, wherein the void 109 in the lower portion of the trench 104 is removed by compressing the silicon dioxide 106, so that a considerably smaller void 109a is formed in the vicinity of the upper portion of the trench 104. As is evident from FIG. 1f, substantially no stress is generated at the upper sidewall portions 105 of the non-oxidizable silicon dioxide layer 102 and the silicon nitride layer 103.

Figure 1G:
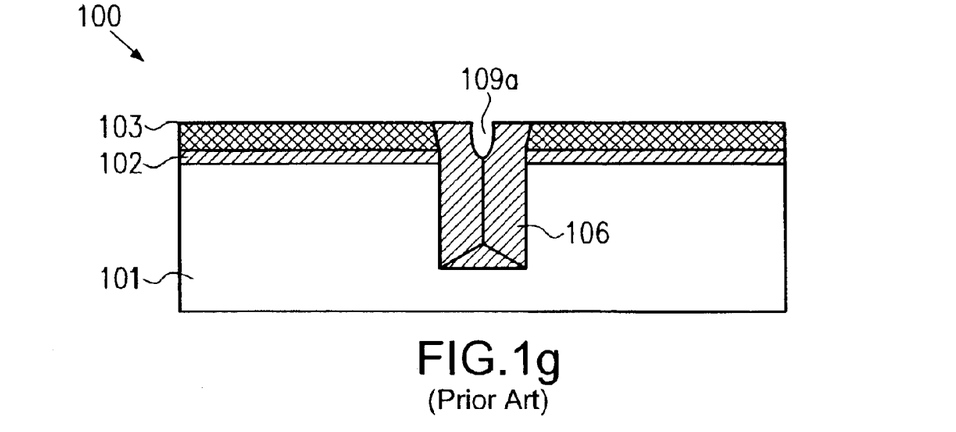

FIG. 1g schematically shows the semiconductor structure 100 after planarizing the substrate 101 by chemically mechanically polishing (CMP) to remove the excess silicon dioxide 106 and partially remove the silicon nitride layer 103, wherein the reduced void 109a is opening to form a groove-like recess that is, for convenience, also denoted by the reference number 109a. The CMP process for removing the excess oxide 106 and planarizing the substrate 101 is a critical step requiring thorough control of the remaining silicon nitride layer 103, since any over-polish of the silicon nitride layer 103 may result in damage of the under-lying silicon of the substrate 101, which represents the active area for the formation of circuit elements such as field effect transistors, thereby compromising the quality of these elements. An "under-polish" of the excess silicon dioxide layer 106 and the underlying silicon nitride layer 103, on the other hand, may significantly adversely affect a subsequent sophisticated photolithography step required for the formation of gate electrodes of the field effect transistors. Consequently, avoiding an opening of the reduced void 109a during the CMP or substantially removing the reduced void 109a by over-polishing would be extremely difficult to achieve without imparting a high risk for subsequent process steps.

Figure 1H:
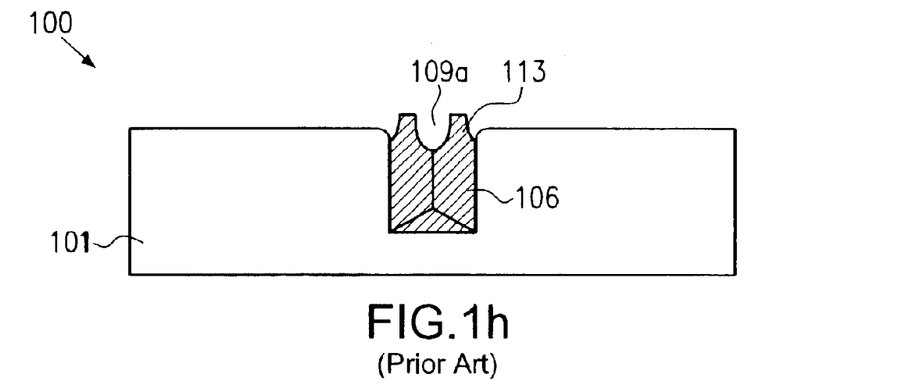

FIG. 1h schematically shows the semiconductor structure 100 after removing the silicon nitride layer 103 and the silicon dioxide layer 102. Typically, these layers are removed by etch processes well known in the art, during which the silicon dioxide 106 in the trench 104 is also partially removed, as indicated by 113, and the size of the recess 109a is further increased. Moreover, the size of the recess 109a may be even further increased by subsequent process steps, such as any clean processes prior to forming a gate insulation layer for any field effect transistors to be formed on the substrate 101.

The recess 109a may represent a source of reduced reliability for circuit elements, such as field effect transistors, since, for example, gate electrode material frequently provided as polysilicon may not be efficiently removed from the recess 109a during the patterning of the gate electrode of the field effect transistors. Thus, an increased leakage current or even short circuits between unrelated gate electrodes may occur, thereby significantly deteriorating production yield.

Since the problems identified above represent a serious drawback for semiconductor technologies, such as CMOS technology, especially if based on sub-0.25 micron design rules, there exists a need for a process technique allowing the filling of openings, such as trenches, with a dielectric material substantially without generating any voids.

SUMMARY OF THE INVENTION

In general, the present invention is directed to a method allowing openings or recessed portions, such as trenches used for isolation structures, to be filled with a dielectric material, wherein the formation of voids may be substantially avoided by creating a stress to the deposited dielectric material substantially along the entire depth of the recessed portion. This is achieved by depositing a layer of oxidizable material in the recessed portion, thereby covering the inner sidewalls of the recessed portion prior to filling in the dielectric material. In a subsequent oxidation process, the oxidizable material is oxidized and exerts stress to the dielectric material along substantially the entire depth of the recessed portion, irrespective whether initially sidewall portions of the recessed portion comprise any non-oxidizable areas.

According to one illustrative embodiment of the present invention, a method of filling a trench formed in a substrate comprises conformally depositing a spacer layer comprised of oxidizible material on the substrate and in the trench. Then, a dielectric material is deposited over the spacer layer to fill the trench and an oxidation process in an oxidizing ambient is carried out to convert at least a portion of the spacer layer into an insulating layer.

According to a further illustrative embodiment of the present invention, a method of filling a trench formed in a substrate with a dielectric material comprises forming spacer elements on sidewalls of the trench, wherein the spacer elements are comprised of an oxidizable material. Next, a dielectric material is deposited over the substrate to substantially fill the trench and the substrate is exposed to an oxidizing ambient to convert the spacer elements at least partially into an insulating layer.

According to yet another illustrative embodiment of the present invention, a method of filling a trench in a substrate comprising a layer of a semiconductive material and a layer of a dielectric material formed thereon comprises forming sidewall spacers of a semiconductive material in the trench, wherein the sidewall spacers cover non-oxidizable sidewall portions of the trench. Then, the trench is filled with a dielectric material and the substrate is exposed to an oxidizing ambient to at least partially oxidize the sidewall spacers.

In accordance with still another illustrative embodiment of the present invention, a method of forming an isolation structure in a substrate comprising a semiconductive layer and a dielectric layer stack formed on the semiconductive layer comprises forming a trench in the substrate, wherein the trench extends in a depth dimension through the dielectric layer stack. A spacer layer is conformally deposited on the substrate, whereby the spacer layer is comprised of an oxidizable material. Next, a dielectric material for filling the trench is deposited and the substrate is exposed to an oxidizing ambient to at least partially oxidize the spacer layer to fill any void that may have formed during deposition of the dielectric material.

In a further embodiment of the present invention, a method of forming shallow trench isolation structures in a substrate of a semiconductive material during a manufacturing process for manufacturing integrated circuits comprises forming a first layer of dielectric material on the substrate of semiconductive material. Then, the first layer of dielectric material and the substrate of semiconductive material are selectively etched so as to form trenches deeper than the thickness of the layer of dielectric material. Sidewall spacers of a semiconductive material are formed in the trenches, wherein the sidewall spacers cover the inside sidewalls of the trenches. Thereafter, the trenches are filled with a dielectric material and the sidewall spacers are oxidized along the entire depth of the trench sidewalls.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to FIGS. 2a–2d, some illustrative embodiments of the present invention will now be described, wherein an opening or a recessed portion, for example in the form of a trench, is to be substantially completely filled with a dielectric material even for lateral dimensions of the recessed portion in the order of 0.25 μm to 0.13 μm or even less with a depth of up to several hundred nanometers.

Figure 2A:
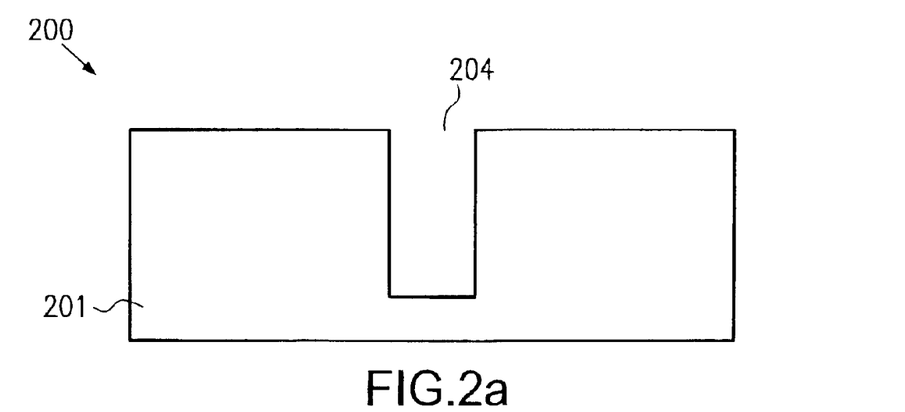
FIGS. 2a–2d schematically show cross-sectional views of a process sequence for filling a trench with a dielectric material according to one illustrative embodiment of the present invention.

In FIG. 2a, a structure 200, for example a semiconductor structure, comprises a substrate 201, which may represent a semiconductor substrate, an insulating substrate, a substrate having formed thereon one or more material layers such as semiconductor layers, dielectric layers and the like. In the following, the substrate 201 is meant to describe a material in which a highly insulating, substantially void-free isolation structure is to be formed, whereby the substrate 201 may be comprised, at least partially, of a substantially non-oxidizable material. An opening or a recessed portion, such as a trench 204, is formed in the substrate 201 and is to be filled with a dielectric material. The lateral dimensions of the trench 204 may be on the order of 0.25 μm and less and the depth may range to some hundred nanometers. The trench 204 may be formed according to well-known advanced photolithography and etch techniques and thus a description thereof will be omitted.

Figure 2B:
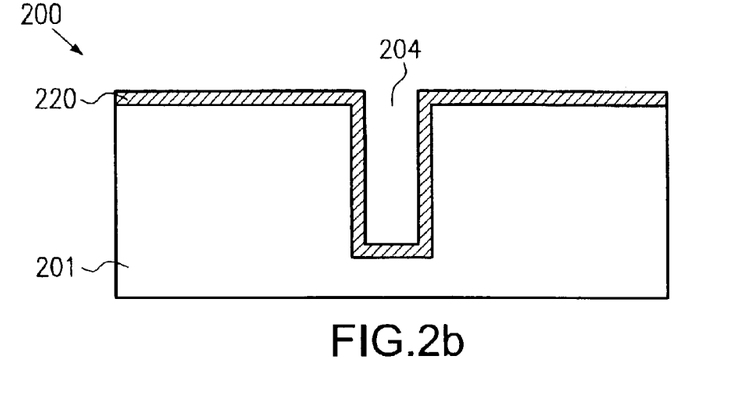

FIG. 2b schematically shows the structure 200 with a spacer layer 220 comprised of an oxidizable material, such as a semiconductor material, for example, silicon, germanium and the like. A thickness of the spacer layer 220 may range from some nanometers to some tens of nanometers, depending on the lateral dimensions of the trench 204. The thickness of the spacer layer 220 may be selected so that an increase in volume upon oxidizing the spacer layer 220 is sufficient to overcompensate for any voids created at non-oxidizable sidewall portions of the trench 204. In some embodiments, in which the substrate 201 may be comprised of an oxidizable material, a thin non-oxidizable liner (not shown) may be formed prior to depositing the spacer layer 220 to avoid oxidation of the substrate 201 in further processing. As previously explained with reference to FIGS. 1a–1h, the spacer layer 220, for example comprised of silicon, may be deposited by advanced deposition methods, such as low atmospheric pressure CVD or high density plasma-enhanced CVD that allow substantial conformal deposition of the spacer layer 220 to a thickness of approximately some tens of nanometers.

Figure 2C:
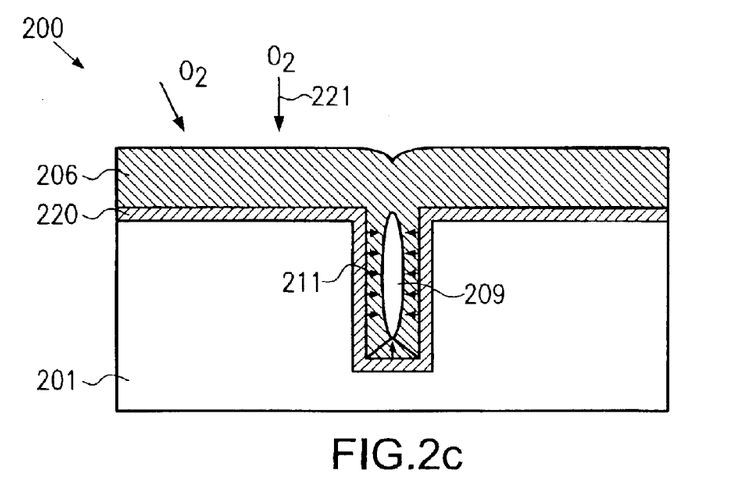

FIG. 2c schematically depicts the structure 200 with a dielectric layer 206 formed thereon, wherein the trench 204 is filled by the dielectric layer 206, thereby forming a void 209 with reasons previously explained with reference to FIGS. 1a–1h. The dielectric layer 206 may be comprised of an oxide, such as a silicon dioxide or any other appropriate dielectric material, as long as a sufficient diffusion of oxygen, indicated as 221, into the underlying spacer layer 220 is insured during a subsequent oxidation process.

The dielectric layer 206 may be deposited by any appropriate deposition method, such as sub-atmospheric pressure CVD, low pressure CVD, plasma enhanced CVD, high density plasma enhanced CVD and the like. Subsequently, the semiconductor structure 200 is exposed to an oxidizing ambient, wherein oxygen diffuses to the spacer layer 220 and forms an additional oxide, the volume of which exceeds the volume of the consumed material of the spacer layer 220 so that a stress, indicated by 211 is exerted to the dielectric material 206 enclosing the void 209. Contrary to a conventional deposition method, as for example described with reference to FIGS. 1a–1h, the stress is exerted substantially along the entire depth of the trench 204, since the oxidizable spacer layer 220 covers the complete sidewall of the trench 204. Thus, irrespective whether the trench 204 includes non-oxidizable sidewall portion, for example in case the substrate 201 may be comprised of a layer stack in which the trench 204 is formed, stress is exerted to the void 209 along the entire depth.

Figure 2D:
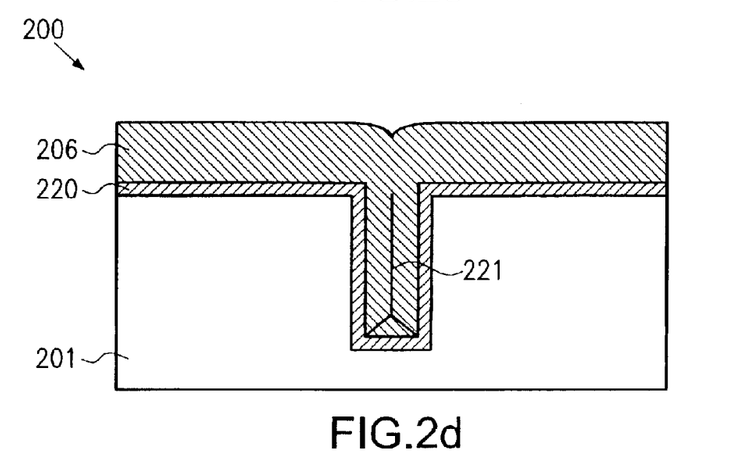

FIG. 2d shows the semiconductor structure 200 after completion of the oxidation process, wherein the void 209 is substantially completely filled. Typical deposition seams 221 are depicted in the trench 204, which will not, however, substantially adversely affect the further processing of the semiconductor structure 200. In one embodiment, the oxidation process is carried out for a time period sufficient to substantially completely oxidize the spacer layer 220 such that the trench 204 is reliably completely filled with dielectric material, i.e., the oxide of the spacer layer 220 and the dielectric material 206.

In other embodiments, the structure as depicted in FIG. 2b may be anisotropically etched to remove the spacer layer 220 partially or even substantially completely from the surface portion of the substrate 201 and the bottom of the trench 204 prior to depositing the dielectric layer 206. Thus, the sidewalls of the trench 204 maintain covered by the dielectric layer 206 as will be discussed in more detail with reference to FIGS. 3a–3h. Substantially completely removing the spacer layer 220 from the bottom of the trench 204 has the advantage that even an incomplete oxidation of the spacer layer 220, which is then only provided at the sidewalls of the trench 204, does not provide a conductive path within the trench 204 by any non-oxidized material of the spacer layer 220.

The semiconductor structure 200 as shown in FIG. 2d may then be further processed, for example by planarizing the structure by means of CMP, wherein substantially no recess or groove is formed on the filled trench 204.

With reference to FIGS. 3a–3h, further illustrative embodiments of the present invention will now be described thereby referring to an STI structure similar to that described in the introductory part of the application.

Figure 3A:
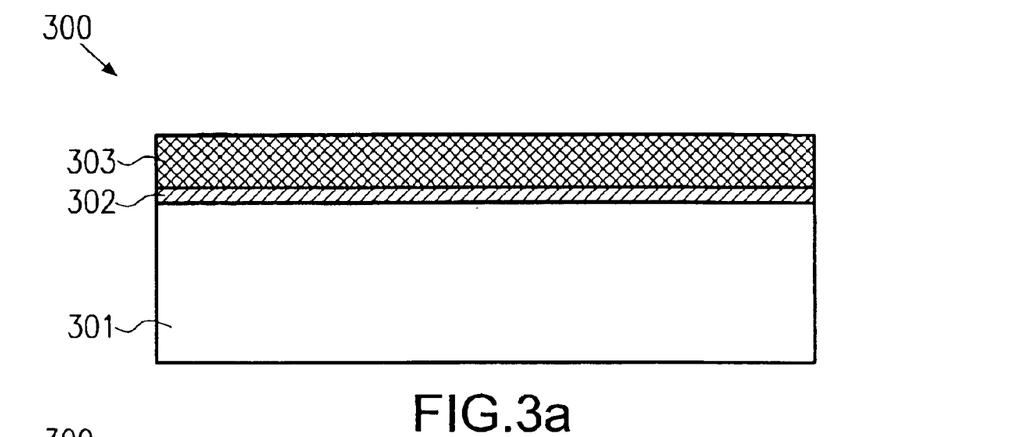
FIGS. 3a–3h schematically show cross-sectional views of a process sequence in accordance with one illustrative embodiment of the present invention for forming a shallow trench isolation structure usable in sophisticated semiconductor devices.

FIG. 3a shows a semiconductor structure 300 comprising a substrate 301 having formed thereon a first insulating layer 302 and a second insulating layer 303, which may be comprised of silicon dioxide and silicon nitride, respectively. Regarding the materials used for the substrate 301 and the first and second insulating layer 302, 303, the same criteria apply as pointed out with reference to FIGS. 1a–1h.

Figure 3B:
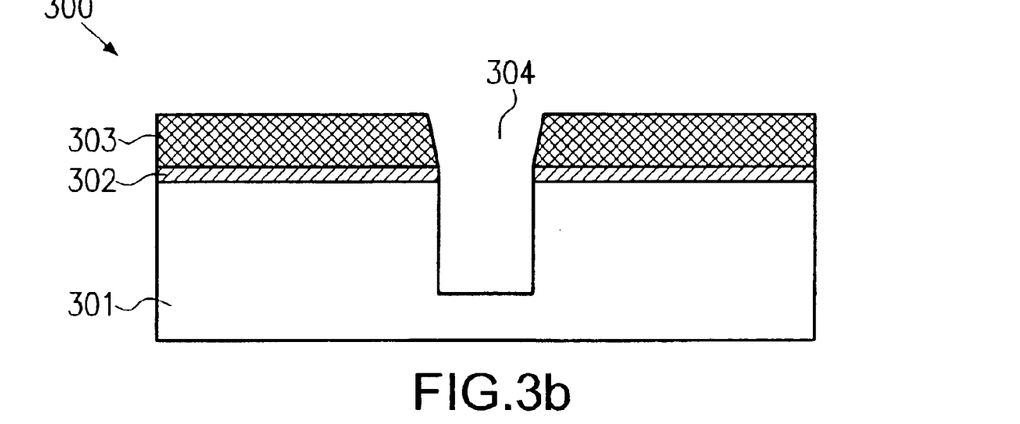

FIG. 3b shows the semiconductor structure 300 after the formation of a trench 304 in the first and second insulating layers 302, 303 and the substrate 301. Forming the trench 304 may include similar process steps as already described with reference to FIGS. 1a and 1b, and the corresponding description thereof will be omitted.

Figure 3C:
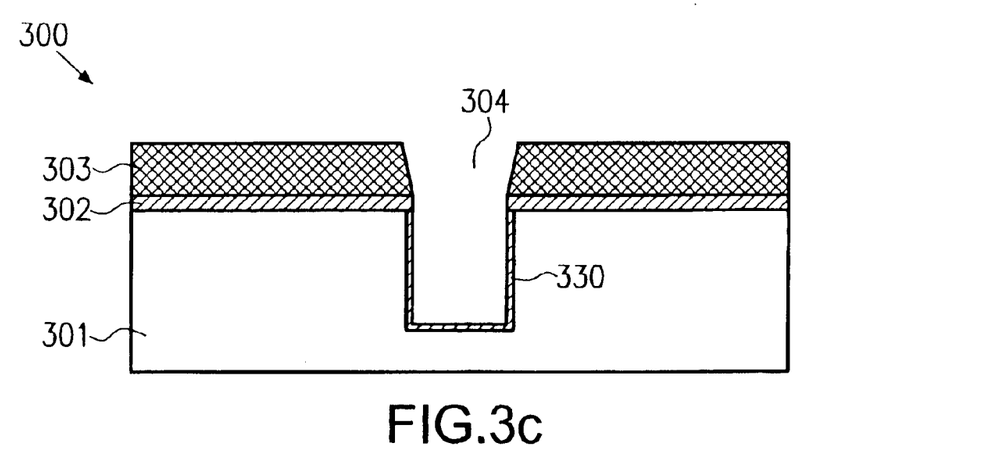

FIG. 3c depicts the semiconductor structure 300 after completion of a thermal growth process, according to one illustrative embodiment, to form a thin oxide layer 330 that may serve as an etch stop layer in subsequent process steps.

Figure 3D:
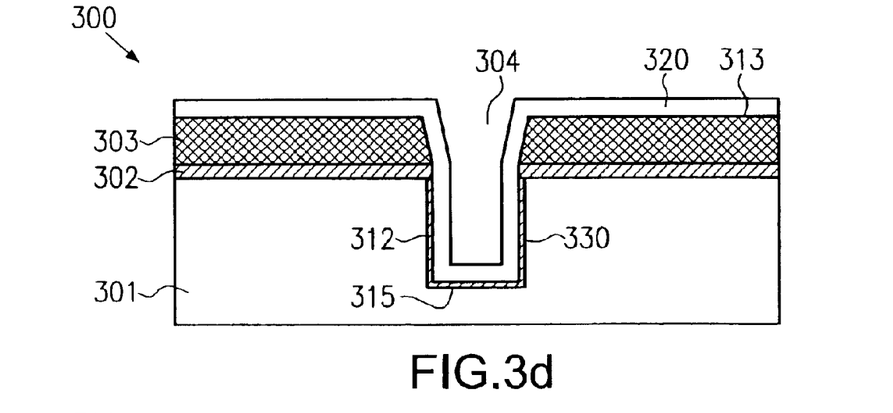
Figure 3E:
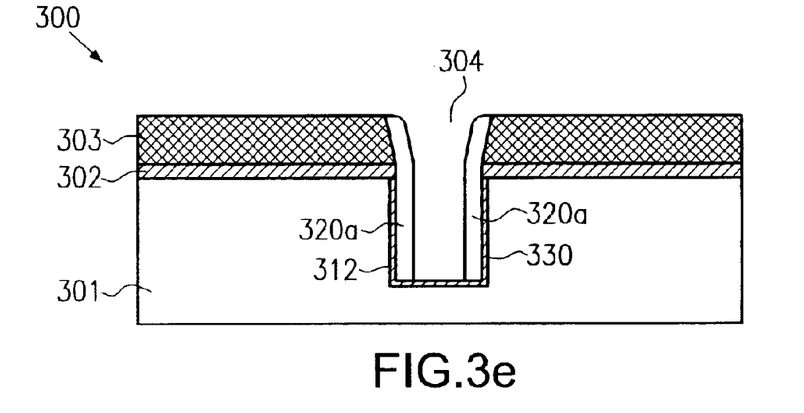

FIG. 3d shows the semiconductor structure 300 after deposition of a spacer layer 320 comprised of an oxidizable material, such as silicon, germanium, or any other material that is compatible with the further processing of integrated circuits and forms an insulating oxide. Since a thickness of the spacer layer 320 is in the range of some nanometers to some tens of nanometers, the spacer layer 320 may be deposited substantially conformally so as to completely cover inner sidewall portions 312 of the trench 304. Subsequently, the semiconductor structure 300 may be subjected to an anisotropic etch process to remove the spacer layer 320 from surface portions 313 of the second insulating layer 303 and from the bottom 315 of the trench 304. During this anisotropic etch process, the thin oxide layer 330 may act as an etch stop layer to prevent undesired etching of the substrate 301 at the bottom 315 of the trench 304. As already pointed out with reference to FIGS. 2a–2d, in other embodiments, it may be appropriate to omit the formation of the oxide layer 330 and to only partially remove the spacer layer 320 or even completely omit the anisotropic etch process so as to substantially leave the spacer layer 320 intact. Upon completion of the anisotropic etch process, the spacer layer 320 is partially removed and sidewall spacers 320a on the sidewalls 312 of the trench 304 are formed.

Figure 3F:
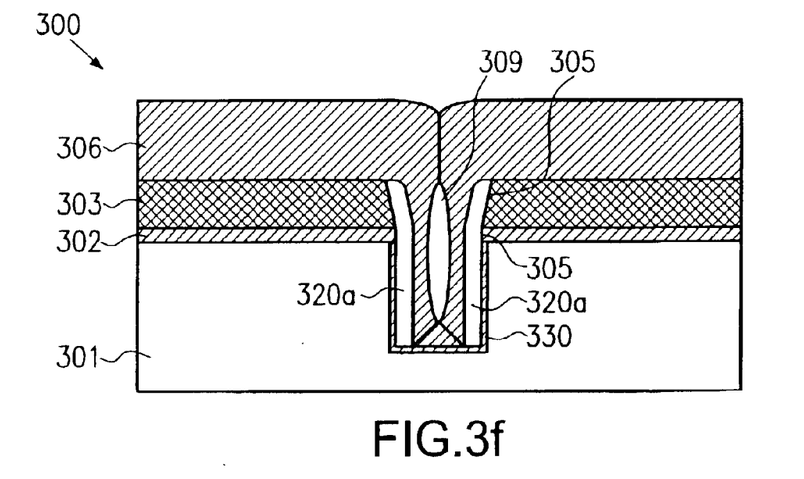
Figure 3G:
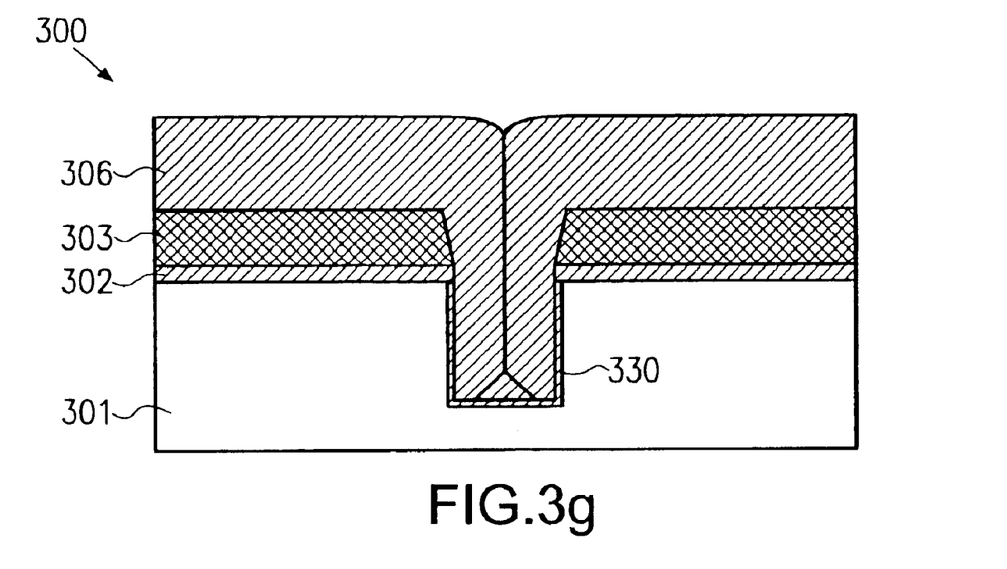

FIG. 3f shows the semiconductor structure 300 with a layer of dielectric material 306 deposited on the substrate 301 and partially filled in the trench 304, thereby creating a void 309. The dielectric material 306 may be any appropriate material, such as silicon dioxide, that allows the diffusion of oxygen to support the oxidation of the sidewall spacers 320a. Regarding the deposition method for providing the dielectric layer 306, the same criteria apply as already pointed out with reference to FIGS. 1a–1h and 2a–2d. It is important to note that, contrary to conventional processing, the entire sidewall portions 312 of the trench 304, including the non-oxidizable tapered portions 305 and the sidewall portion 305a corresponding to the first insulating layer 302, are covered by the oxidizable sidewall spacers 320a. Upon exposing the semiconductor structure 300 to an oxidizing ambient, the sidewall spacers 320a are oxidized and exert a stress to the dielectric material 306 in the trench 304 along the entire depth of the trench 304, so that the void 309 is substantially completely closed. FIG. 3g shows the resulting structure after completion of the oxidation process.

Figure 3H:
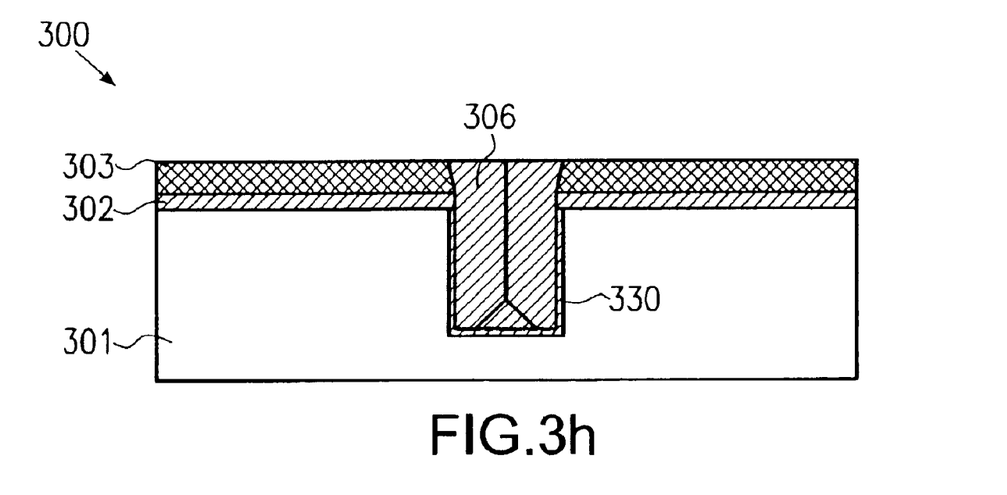

FIG. 3h schematically shows the semiconductor structure 300 after performing a CMP process to remove excess material of the dielectric layer 306 and of the second insulating layer 303, thereby planarizing the surface of the substrate 301. Contrary to the prior art process flow, the present invention allows, a surface portion of the filled trench 304 to be obtained substantially without any recesses or grooves formed on the isolation structure. The first and second insulating layers 302, 303 may then be removed as described in the prior art processing.

It should be pointed out that the embodiments described above are especially advantageous in forming STI isolation structures in silicon-based semiconductor devices. However, the principles of the present invention are also applicable to any trench filling process requiring the reliable deposition of a dielectric material within an opening, for example a trench or a via, with a dielectric material, wherein the size and the dimension of the opening leads to a formation of a void during the filling process, even if highly sophisticated deposition methods are used. Providing an oxidizable spacer layer with a thickness that is readily depositable in a highly conformal manner along the entire depth of the opening by presently well-established deposition methods allows in a subsequent oxidizing step the removal of any void created during deposition of the bulk dielectric material. Providing only a relatively thin oxidizable spacer layer, instead of trying to completely fill the opening with the spacer layer, can be accomplished without unduly prolonging the process time, since oxidizing the thin spacer layer or sidewall spacers may be accomplished within reasonable oxidation times.

Moreover, the method of the present invention allows the isolation structure to be scaled within a wide range of measurements, for example from several $\mu$m to 0.15 $\mu$m and even less, while using well-established deposition methods. By selecting oxidizable materials, the thickness of the spacer layer and the type of deposition technique with respect to the width and depth of the opening to be filled, the embodiments described herein may be readily adapted to specific process requirements without necessitating undue variations of already existing process sequences. Moreover, the scaling of future device generations may be accomplished by well-established deposition recipes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of filling a trench formed in a substrate, the method comprising:
   conformally depositing a spacer layer comprised of an oxidizible material on said substrate and in said trench, wherein said substrate comprises at least one non-oxidizable insulating layer formed thereon, whereby said trench is formed in said at least one insulating layer and partially in said substrate;
   depositing a dielectric material over said spacer layer to fill said trench; and
   after said dielectric material is deposited, performing an oxidation process in an oxidizing ambient to convert at least a portion of said spacer layer into an insulating layer.

2. The method of claim 1, wherein said spacer layer is substantially completely oxidized.

3. The method of claim 1, further comprising anisotropically etching said spacer layer prior to depositing said dielectric material.

4. The method of claim 3, further comprising forming an etch stop layer prior to depositing said spacer layer.

5. The method of claim 1, wherein performing said oxidation process converts at least a portion of said spacer layer to silicon dioxide.

6. The method of claim 4, wherein said spacer layer is anisotropically etched to form sidewall spacers in said trench prior to depositing said dielectric material.

7. The method of claim 1, wherein said trench has at least one lateral dimension of 0.25 $\mu$m or less.

8. The method of claim 1, wherein a depth of said trench is in the range of approximately 200–700 nm.

9. The method of claim 1, wherein said dielectric material is an oxide of a semiconductive material.

10. A method of filling a trench formed in a substrate with a dielectric material, the method comprising:
    forming spacer elements on sidewalls of said trench, said spacer elements being comprised of an oxidizable material;
    depositing a dielectric material over said substrate to substantially fill said trench; and
    after said dielectric material is deposited, exposing said substrate to an oxidizing ambient to convert at least a portion of said spacer elements into an insulating layer.

11. The method of claim 10, wherein forming said spacer elements comprises depositing a spacer layer on said substrate and in said trench and anisotropically etching said spacer layer to remove said spacer layer at the bottom of said trench.

12. The method of claim 11, further comprising forming an etch stop layer prior to depositing said spacer layer.

13. The method of claim 12, wherein said etch stop layer is formed by oxidizing said substrate to form an oxide layer within said trench.

14. The method of claim 10, wherein said substrate comprises an insulating layer stack formed on a semiconductive layer, wherein said trench is formed in said insulating layer stack and at least partially in said semiconductive layer.

15. The method of claim 14, wherein said insulating layer stack comprises a silicon nitride layer and a silicon oxide layer.

16. The method of claim 11, wherein a thickness of said spacer layer is in the range of approximately 5–100 nm.

17. A method of filling a trench in a substrate, said substrate comprising a layer of a semiconductive material and a layer of a dielectric material formed thereon, said method comprising:
    forming sidewall spacers of a semiconductive material in said trench, the sidewall spacers covering non-oxidizable sidewall portions of said trench;
    filling said trench with a dielectric material; and
    after filling said trench, exposing said substrate to an oxidizing ambient to at least partially oxidize said sidewall spacers.

18. The method of claim 17, wherein forming said sidewall spacers in the trench comprises conformally depositing a second layer of a semiconductive material on said substrate.

19. The method of claim 18, further comprising anisotropically etching said second layer of semiconductive material so as to remove said second semiconductive material from areas of said substrate outside said trench and from a bottom of said trench.

20. The method of claim 19, wherein filling said trench with a dielectric material comprises depositing a second layer of a dielectric material on said substrate.

21. The method of claim 20, further comprising forming an oxide layer inside said trench prior to conformally depositing said second layer of a semiconductive material.

22. The method of claim 21, wherein oxidizing said sidewall spacers comprises subjecting said substrate to a thermal oxidation process at a temperature in the range of approximately 600–1100 °C.

23. The method of claim 18, wherein said second layer of a semiconductive material is deposited by one of a sub-atmospheric chemical vapor deposition process and a high density plasma-enhanced chemical vapor deposition process.

24. The method of claim 20, wherein said second layer of a dielectric material is deposited by one of a sub-atmospheric chemical vapor deposition process and a high density plasma-enhanced chemical vapor deposition process.

25. The method of claim 19, wherein said layer of semiconductive material and said second layer of semiconductive material comprises silicon.

26. The method of claim 20, wherein said layer of dielectric material and said second layer of dielectric material comprises silicon dioxide.

27. A method of forming an isolation structure in a substrate comprising a semiconductive layer and a dielectric layer stack formed on said semiconductive layer, the method comprising:
    forming a trench in said substrate, said trench extending in a depth dimension through said dielectric layer stack;

conformally depositing a spacer layer on said substrate, said spacer layer being comprised of an oxidizable material;

depositing a dielectric material for filling said trench; and after depositing said dielectric material for filling said trench, exposing said substrate to an oxidizing ambient to at least partially oxidize said spacer layer to fill any void that may have formed during the deposition of said dielectric material.

28. The method of claim 27, further comprising anisotropically etching said spacer layer prior to depositing said dielectric material to form sidewall spacers on sidewalls of said trench.

29. The method of claim 28, further comprising forming an etch stop layer prior to depositing said spacer layer.

30. The method of claim 27, wherein one lateral dimension of said trench is 0.25 $\mu$m or less.

31. The method of claim 27, wherein said dielectric material is a semiconductor oxide.

32. The method of claim 27, wherein said spacer layer comprises one of silicon and germanium.

33. The method of claim 27, wherein a thickness of said spacer layer is in the range of approximately 5–100 nm.

34. A method of forming shallow trench isolation structures in a substrate of a semiconductive material during a manufacturing process for manufacturing integrated circuits, said method comprising:

forming a first layer of dielectric material to a first thickness on said substrate of semiconductive material;

selectively etching said first layer of dielectric material and said substrate of semiconductive material so as to form trenches deeper than said first thickness of said first layer of dielectric material, said trenches having sidewalls, each of said trenches having a bottom, inside sidewalls and a depth;

forming sidewall spacers comprised of a semiconductive material in said trenches, said sidewall spacers covering the inside sidewalls of said trenches;

filling said trenches with a dielectric material; and after filling said trenches with a dielectric material, oxidizing the entirety of said sidewall spacers along said inside sidewalls of said trenches.

35. The method of claim 34, wherein forming said sidewall spacers in said trenches comprises conformally depositing a layer of a semiconductive material on said first layer of dielectric material to a thickness allowing complete sidewall coverage inside said trenches.

36. The method of claim 35, further comprising anisotropically etching said layer of a semiconductive material so as to remove portions of said semiconductive material that are positioned above said first layer of dielectric material outside said trenches and above the bottom of said trenches.

37. The method of claim 36, wherein filling said trenches with a dielectric material comprises depositing a third layer of a dielectric material on said first layer of dielectric material.

38. The method of claim 34, further comprising thermal growing of a liner layer of dielectric material inside said trenches prior to conformally depositing said layer of a semiconductive material.

39. The method of claim 34, wherein oxidizing said sidewall spacers is performed at a temperature in the range of about 600–1100° C.

40. The method of claim 34, wherein said layer of a semiconductive material is deposited by a sub-atmospheric chemical vapor deposition process.

41. The method of claim 40, wherein said first layer of a dielectric material is deposited according to one of a sub-atmospheric chemical vapor deposition process and a high density plasma-enhanced chemical vapor deposition process.

42. The method of claim 35, wherein said semiconductive material of said substrate and said second layer comprises silicon.

43. The method of claim 35, wherein said first layer of dielectric material comprises silicon dioxide.

44. A method of filling a trench in a substrate, said substrate comprising a layer of a semiconductive material and a layer of a dielectric material formed thereon, said method comprising:

forming sidewall spacers of a semiconductive material in said trench, the sidewall spacers covering non-oxidizable sidewall portions of said trench, wherein said step of forming said sidewall spacers in the trench comprises conformally depositing, by one of a sub-atmospheric chemical vapor deposition process and a high density plasma-enhanced chemical vapor deposition process, a second layer of a semiconductive material on said substrate;

filling said trench with a dielectric material; and exposing said substrate to an oxidizing ambient to at least partially oxidize said sidewall spacers.

45. A method of filling a trench in a substrate, said substrate comprising a layer of a semiconductive material and a layer of a dielectric material formed thereon, said method comprising:

forming sidewall spacers of a semiconductive material in said trench, the sidewall spacers covering non-oxidizable sidewall portions of said trench;

filling said trench with a dielectric material, wherein said step of filling said trench with a dielectric material comprises depositing, by one of a sub-atmospheric chemical vapor deposition process and a high density plasma-enhanced chemical vapor deposition process, a second layer of a dielectric material on said substrate; and exposing said substrate to an oxidizing ambient to at least partially oxidize said sidewall spacers.

46. A method of forming shallow trench isolation structures in a substrate of a semiconductive material during a manufacturing process for manufacturing integrated circuits, said method comprising:

forming a first layer of dielectric material to a first thickness on said substrate of semiconductive material;

selectively etching said first layer of dielectric material and said substrate of semiconductive material so as to form trenches deeper than said first thickness of said layer of dielectric material, said trenches having inside sidewalls;

forming sidewall spacers comprised of a semiconductive material in said trenches, said sidewall spacers covering the inside sidewalls of said trenches, wherein said step of forming said sidewall spacers comprises depositing said layer of a semiconductive material by a sub-atmospheric chemical vapor deposition process;

filling said trenches with a dielectric material; and oxidizing the entirety of said sidewall spacers along said inside sidewalls of said trenches.

47. A method of filling a trench formed in a substrate, the method comprising:

conformally depositing a spacer layer comprised of an oxidizible material on said substrate and in said trench, wherein said substrate comprises a semiconductor layer and a non-oxidizable insulating layer formed on said semiconductor layer, whereby said trench is formed in said insulating layer and at least partially in said semiconductor layer;

depositing a dielectric material over said spacer layer to fill said trench; and after said dielectric material is deposited, performing an oxidation process in an oxidizing ambient to convert at least a portion of said spacer layer into an insulating layer.

48. The method of claim 47, wherein said spacer layer is substantially completely oxidized.

49. The method of claim 47, further comprising anisotropically etching said spacer layer prior to depositing said dielectric material.

50. The method of claim 47, wherein said semiconductor layer comprises at least one of silicon and germanium.

51. The method of claim 47, wherein said non-oxidizable insulating layer comprises silicon nitride.

52. A method of filling a trench formed in a substrate, the method comprising:

conformally depositing a spacer layer comprised of an oxidizible material on said substrate and in said trench;

depositing a dielectric material over said spacer layer to fill said trench, wherein said dielectric material is an oxide of a semiconductive material; and after said dielectric material is deposited, performing an oxidation process in an oxidizing ambient to convert at least a portion of said spacer layer into an insulating layer.

53. The method of claim 52, wherein said spacer layer is substantially completely oxidized.

54. The method of claim 52, further comprising anisotropically etching said spacer layer prior to depositing said dielectric material.

55. A method of filling a trench formed in a substrate, the method comprising:

conformally depositing a spacer layer comprised of an oxidizible material on said substrate and in said trench;

anisotropically etching said spacer layer;

after anisotropically etching said spacer layer, depositing a dielectric material over said anisotropically etched spacer layer to fill said trench; and after said dielectric material is deposited, performing an oxidation process in an oxidizing ambient to convert at least a portion of said spacer layer into an insulating layer.

56. The method of claim 55, wherein said spacer layer is substantially completely oxidized.

57. The method of claim 55, further comprising forming an etch stop layer prior to depositing said spacer layer.

58. The method of claim 55, wherein said substrate comprises a semiconductor layer and a non-oxidizable insulating layer formed on said semiconductor layer, whereby said trench is formed in said insulating layer and at least partially in said semiconductor layer.

59. The method of claim 55, wherein said dielectric material is an oxide of a semiconductive material.

* * * * *